(12) United States Patent
Byléhn et al.

(10) Patent No.: US 7,912,569 B2
(45) Date of Patent: Mar. 22, 2011

(54) METHOD FOR GENERATING A JETTING PROGRAM

(75) Inventors: Jens Byléhn, Sollentuna (SE); Håkan Sandell, Täby (SE); William Holm, Alvsjo (SE)

(73) Assignee: Mydata Automation AB, Bromma (SE)

( * ) Notice: Subject to any disclaimer, the term of this patent is extended or adjusted under 35 U.S.C. 154(b) by 380 days.

(21) Appl. No.: 10/578,885

(22) PCT Filed: Nov. 15, 2004

(86) PCT No.: PCT/SE2004/001668
§ 371 (c)(1),
(2), (4) Date: Jul. 6, 2006

(87) PCT Pub. No.: WO2005/048678
PCT Pub. Date: May 26, 2005

(65) Prior Publication Data
US 2007/0146404 A1    Jun. 28, 2007

(30) Foreign Application Priority Data
Nov. 13, 2003  (SE) .................................... 0302985

(51) Int. Cl.
*G06F 19/00* (2006.01)
*B23K 1/00* (2006.01)

(52) U.S. Cl. ........ 700/123; 700/117; 700/118; 700/119; 700/120; 700/121; 228/33; 228/43

(58) Field of Classification Search .................. None
See application file for complete search history.

(56) References Cited

U.S. PATENT DOCUMENTS 5,465,879 A * 11/1995 La et al. .................... 222/189.06
5,564,007 A * 10/1996 Kazen-Goudarzi et al. .. 715/763
5,711,989 A * 1/1998 Ciardella et al. ................ 427/8
(Continued)

FOREIGN PATENT DOCUMENTS
EP    0 612 203 A    8/1994
(Continued)

OTHER PUBLICATIONS

Asymtek: "CADImport for Windows—Installation and user Guide", Internet Article, pp. 1-109, XP002353111, Retrieved from the Internet: URL: http://www.asymtek.com/support/manuals/cadimport_for_windows_v1.1_rev_a.pdf>, retrieved on Nov. 8, 2005.

*Primary Examiner* — Albert Decady
*Assistant Examiner* — Sunray R Chang
(74) *Attorney, Agent, or Firm* — Birch, Stewart, Kolasch & Birch, LLP

(57) ABSTRACT

A method for generating data for a jetting program, includes the steps of: a) obtaining substrate data for a substrate, which is to be provided with deposits and components; and b) for each component which is to be placed on the substrate: —fetching component data for the component from said substrate data; and—selecting a matching predefined deposit pattern, comprising at least one deposit, which matches a desired deposit pattern for said component data, wherein the deposit pattern comprises, for the/each deposit, deposit data comprising deposit extension and deposit position; or—if no matching predefined deposit pattern exists, defining a deposit pattern, comprising at least one deposit, for the component data, comprising the step of defining, for the/each deposit, deposit data, which step comprises determining deposit extension and deposit position.

20 Claims, 7 Drawing Sheets

U.S. PATENT DOCUMENTS

| | | | |
|---|---|---|---|
| 5,882,451 A * | 3/1999 | Sasaki et al. | 156/64 |
| 5,938,102 A * | 8/1999 | Muntz et al. | 228/102 |
| 6,317,513 B2 * | 11/2001 | Michael et al. | 382/145 |
| 6,361,831 B1 * | 3/2002 | Sato et al. | 427/430.1 |
| 2001/0044669 A1 | 11/2001 | Koduri et al. | |
| 2002/0037372 A1 * | 3/2002 | Sato et al. | 427/430.1 |
| 2002/0039662 A1 * | 4/2002 | Ducros et al. | 428/560 |
| 2002/0190203 A1 * | 12/2002 | Valaskovic et al. | 250/288 |
| 2004/0217193 A1 * | 11/2004 | Holm et al. | 239/112 |

FOREIGN PATENT DOCUMENTS

| | | |
|---|---|---|
| JP | 4-367001 A | 12/1992 |
| JP | 7-265772 A | 10/1995 |
| JP | 9-260823 A | 10/1997 |
| JP | 2001-320159 A | 11/2001 |
| JP | 2003-140178 | 5/2003 |

* cited by examiner

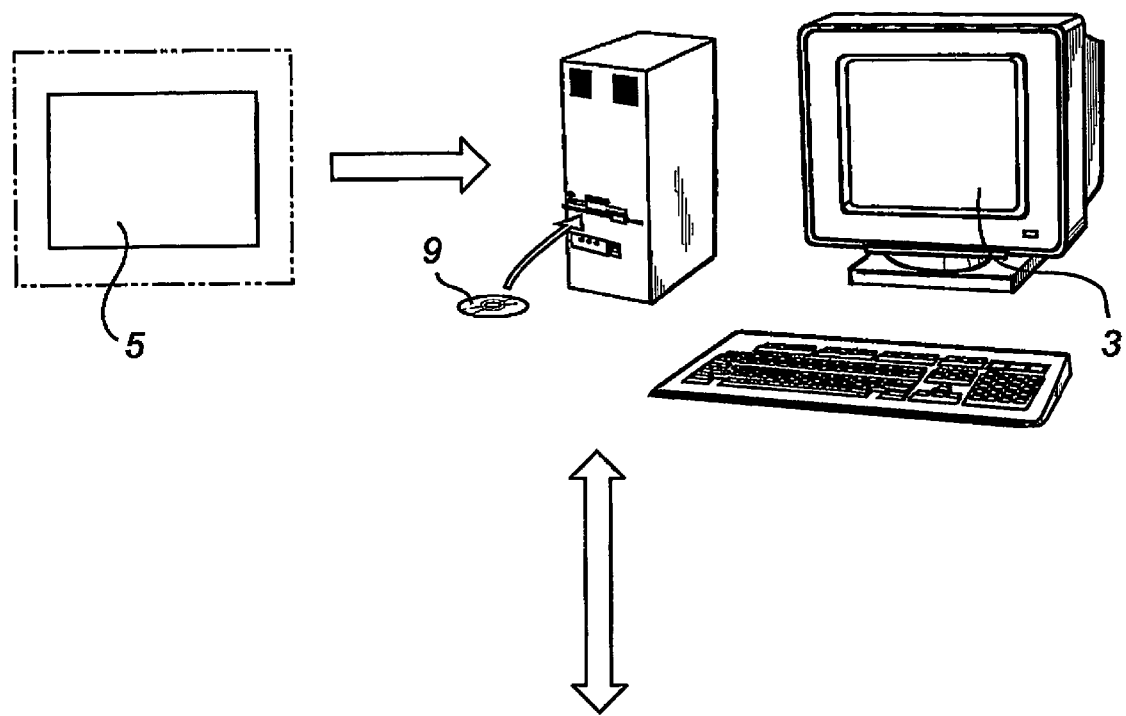
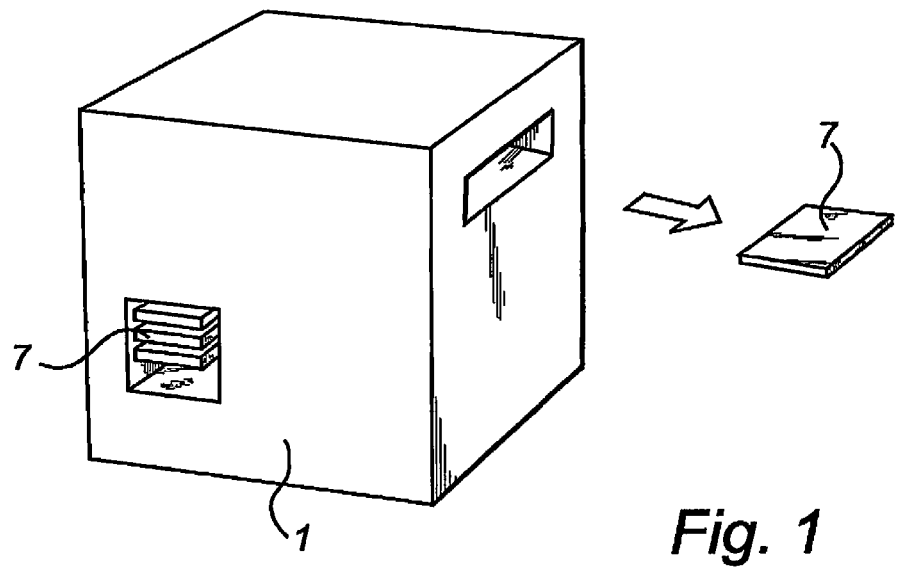
Fig. 1

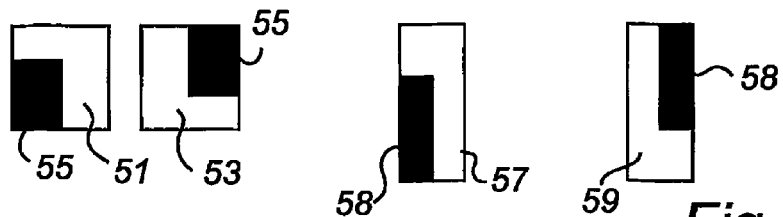
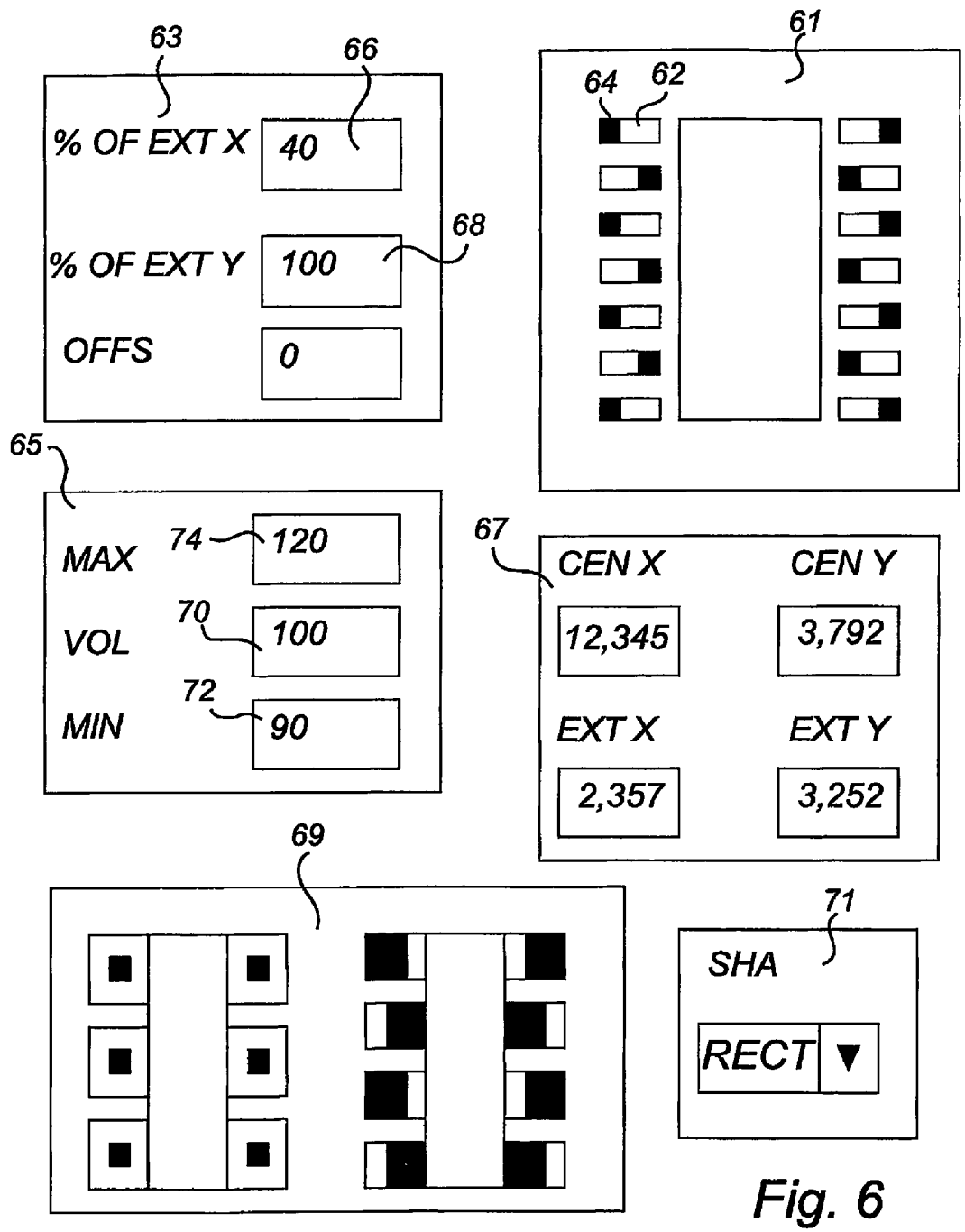
Fig. 6

METHOD FOR GENERATING A JETTING PROGRAM

TECHNICAL FIELD OF THE INVENTION

The present invention generally relates to the field of jetting droplets of viscous medium onto a substrate. More particularly it relates to methods for generating a jetting program and deposit data for the jetting program to be used by a viscous medium jetting machine.

TECHNICAL BACKGROUND

Machines for jetting droplets of viscous medium, e.g. solder paste or glue, onto a substrate are software controlled. The software needs instructions for how to apply the viscous medium to a specific substrate. These instructions are called a jetting program. Thus, the jetting program supports the process of jetting droplets onto the substrate in order to secure that proper amounts of medium are accurately deposited on predetermined spots of the substrate where pads are provided. A pad is a delimited area of a conducting solid material. For example, such a substrate is provided as a printed circuit board, PCB. Leads of the components that are to be mounted on the substrate will be positioned onto the pads, and adhered thereto by means of the medium, which is electrically conducting.

Typically, the preprocessing that generates the jetting program is performed off-line, and involves some manual steps performed by an operator.

Thus, generally, the generation of the jetting program involves importing, to a generation program, substrate data relating to a unique substrate, or a unique set of identical substrates; and defining, on basis of the substrate data, where on the substrate the droplets are to be jetted.

In a prior art example of a method for generating a jetting program, a program called CADImport is used in the off-line preprocessing phase, generating a jetting program, and a program called Fluidmove®, vended by Asymtek, receives and executes the jetting program upon command. Thus, CADImport is used for importing and processing CAD data or the like about a PCB, and Fluidmove® is used for running the jetting machine on basis of the processed CAD data. The CAD data comprises pad data, i.e. data about position on the PCB and extension of each individual pad, as well as data about position, name and leads of each individual component that is to be mounted on the PCB. Thus, it is also known which pads each respective component will be using. The positions are defined by x and y coordinates, where an xy coordinate system covers the PCB.

An operator who runs the CADImport program basically programs where the droplets of viscous medium are to be jetted onto the PCB, and more particularly on the pads, such that for each lead of every component there will be provided enough medium, which will be correctly positioned. This is a process which requires knowledge of the size of a single droplet, how many droplets that will be sufficient for covering the needs of a specific lead, and where on the pad each droplet should be placed. Typically, the operator can find data about the droplet size in/by means of CADImport, since machine data are usually provided in advance. However, the appropriate xy coordinates for each droplet must be figured out by the operator based on experience. Once the droplets associated with a component of a particular identification (ID) are programmed, the thus obtained droplet configuration may be stored in a component database. In the future, when a component bearing the same ID appears, the droplet configuration may simply be retrieved from the database.

When all droplet configurations for all components have been programmed, the operator initiates a jetting path generation, that generates a jetting path template for how the jetting machine is going to move the jetting nozzle in order to jet the viscous medium droplets onto the PCB in accordance with the operator's intention. The final jetting data, i.e. the jetting path template, is transferred to the Fluidmove® program, which is used for running the jetting machine accordingly.

In spite of the possibility to store and reuse droplet configuration data for the components it is time consuming for the operator to define where each individual droplet is to be placed for every new component that is not registered in the database. This is because the number of different components is vast, and more or less every day new components are put on the market. Consequently, the database is of limited value.

SUMMARY OF THE INVENTION

An object of the present invention is to reduce the time that is consumed by the operator for the off-line preprocessing operation.

This and other objects are achieved according to the present invention by providing methods having the features defined in the independent claims. Preferred embodiments are defined in the dependent claims.

For the purposes of this application, it is to be noted that the term "viscous medium" should be interpreted as solder paste, flux, adhesive, conductive adhesive, or any other kind of medium used for fastening components on a substrate, conductive ink, resistive paste, or the like; that the term "deposit" refers to a connected amount of viscous medium applied at a position on a substrate as a result of one or more jetted droplets; and that the term "substrate" should be interpreted as a printed circuit board (PCB), a substrate for ball grid arrays (BGA), chip scale packages (CSP), quad flat packages (QFP), wafers, flip-chips, or the like.

It is also to be noted that the term "jetting" should be interpreted as a non-contact dispensing process that utilizes a fluid jet to form and shoot droplets of a viscous medium from a jet nozzle onto a substrate, as compared to a contact dispensing process, such as "fluid wetting".

In one aspect of the present invention there is provided a method for generating data for a jetting program. The method comprises the steps of:

obtaining substrate data for a substrate, which is to be provided with deposits and components;

for each component which is to be placed on the substrate:
  fetching component data for the component from said substrate data; and
  selecting a matching predefined deposit pattern, comprising at least one deposit, which matches a desired deposit pattern for said component data, wherein the deposit pattern comprises, for the/each deposit, deposit data comprising deposit extension and deposit position; or
  if no matching predefined deposit pattern exists, defining a deposit pattern, comprising at least one deposit, for the component data, comprising the step of defining, for the/each deposit, deposit data, which step comprises determining deposit extension and deposit position.

In another aspect of the present invention there is provided a method for generating a jetting program for a viscous medium jetting machine. The method comprises the steps of:

obtaining substrate data for a substrate, which is to be provided with deposits and components;

for each component which is to be placed on the substrate:
fetching component data for the component from said substrate data; and
selecting a matching predefined deposit pattern, comprising at least one deposit, which matches a desired deposit pattern for said component data, wherein the deposit pattern comprises, for the/each deposit, deposit data comprising deposit extension and deposit position; or
if no matching predefined deposit pattern exists, defining a deposit pattern, comprising at least one deposit, for the component data, comprising the step of defining, for the/each deposit, deposit data, which step comprises determining deposit extension and deposit position;
determining a jetting sequence on basis of the deposit patterns; and
generating a jetting program on basis of the jetting sequence.

In a further aspect of the present invention, the method of generating a jetting program is expanded to include generating a program for inspecting the result of the very jetting. This inspection control program can be regarded as a part of the jetting program as well as a separate additional part. In any case the inspection program generation is based on data already available due to the jetting program generation. This is in contrast to the prior art where the creation of a the control program for the inspection is a separate task and not an integrated part of programming the jetting apparatus. In the prior art the inspection is sometimes even performed in a separate machine. However, since considerations about, for example, deposit location and extension are made when generating the jetting program it is advantageous to be able to use that information also for generating the program for inspecting the result of the jetting. It should be noted that inspection is not always used, only when the demands on production quality are extra high. In accordance with an embodiment of the generation of an inspection program the operator has the possibility to control to what extent the deposits generated by the jetting program should be inspected. This operator control may be exercised on for example one or more of substrate level, component type level, and individual component level.

Thus, in accordance with the present invention, provided that the operator still provides position data when there is no previously stored matching data, rather than having to program positions for single droplets of viscous medium, the operator merely has to define the extension and position of the total deposit. In addition the scope of the invention encompasses various alternatives of the degree of operator involvement. Below, for example, different degrees of automation as regards the determination of deposit extension and position will be described.

In accordance with embodiments of the methods, the component data comprises at least one predefined reception area of the substrate, wherein at least a part of the/each reception area is/are to be covered with a deposit. The step of defining deposit data comprises determining a reception area coverage for the associated reception area. In these embodiments, since the position and extension of a reception area is automatically predefined, the determination of deposit position is done when a reception area is selected, although the operator may want to adjust it, and the deposit extension is in fact determined when the coverage is determined. A reception area can be any area on the substrate predefined in the substrate data as being adapted to receive viscous medium, an area on the substrate where a component, or a component lead, etc., is to be placed, or formed, etc. Examples thereof will follow in conjunction with the description of embodiments.

In accordance with embodiments of the methods, a deposit position relative to the associated reception area is determined. The deposit does not necessarily have to be centred in the area. Sometimes it is preferable to off-centre a deposit, i.e. to position a deposit closer to one end or side of the area than the others, as will be further explained below.

Often, several reception areas can be treated identically, since they are somehow related. In those cases, embodiments of the methods, enable an operator to make a single definition of a deposit position relative to an associated reception area, and/or make a single definition of a deposit extension, and then make that definition valid for all deposits of the same component, and even for all deposits of all components of the same type on the substrate in question. The result is a deposit pattern, which is associated with a certain configuration of deposits. This can be made equal to a certain component, like in the prior art, but it can also be interpreted and used in a broader sense, as a general deposit configuration, which may very well match with several different components. Thus, in addition, the deposit pattern according to this invention is more generally usable than the droplet configuration for a specific component according to the prior art.

In accordance with embodiments of the methods, the step of defining deposit data comprises the step of defining a deposit volume. According to these embodiments, the operator will have a full control of the deposit, since both the area and the height are settable. By merely defining the area coverage, the determination of the height is left for the program to decide. Usually, and as defined according to other embodiments of the methods, a default volume is predefined, and is adjustable.

In accordance with embodiments of the methods, the step of defining deposit data comprises the step of selecting a non-matching predefined deposit pattern and adjusting the deposit data thereof. This embodiment addresses a situation where there exists a predefined, or stored, deposit pattern which almost matches a desired pattern. By making minor adjustments a full match is obtained. According to the method such minor adjustments are possible and easy to perform, which also saves time for the operator.

In accordance with embodiments of the methods, the step of adjusting the deposit data of the non-matching deposit pattern comprises scaling of the deposits. That is, rather than redefining the deposit data from the beginning it is possible to merely perform a resizing of the existing deposit. Of course, within the scope of the claims, also this operation can be made valid for several deposits in common. This is a further example of time saving operations that are performable by means of the method according to the present invention.

In accordance with embodiments of the methods, the step of defining deposit data comprises applying the deposit pattern to all components of the same type in the substrate data. Thus, when there are a lot of identical components they can be dealt with in common, which substantially reduces the amount of time for performing the methods.

In order to arrive at a final jetting program for the jetting machine the deposit patterns are processed and a jetting sequence is generated. Finally the jetting program is generated on basis of the jetting sequence. As explained above, data about the very machine, the jetting nozzle and performance thereof, etc. is input in other ways and is available at the method steps concerned as will be further explained below, and as known to a person skilled in the art.

In accordance with an embodiment of the method for generating a jetting program according to this invention, the step of determining a jetting sequence comprises the step of converting the deposit patterns into droplet configurations. As is evident, this is performed by software and does not involve any operator work, possibly except for a mere initiation of the conversion operation. This is possible due to the existence of machine data, in combination with the deposit data provided by the operator, as is advantageously recognised in accordance with this invention. Thus, by defining the limits for a deposit, which is preferably done by the operator, and having knowledge about the size of a droplet, it is possible to provide an automated generation of a droplet configuration.

In accordance with an embodiment of the method for generating a jetting program, a path of movement for a jetting nozzle is optimised, for example in respect of the length of the path or the time of movement along the path. This shortens the total jetting time for the substrate.

In accordance with a further aspect of the present invention, there is provided a computer program product comprising computer readable program code for performing any one of the methods. Thus, the computer program product is either designed to enable the performance of the method for generating data for a jetting program or the method for generating the jetting program. There are many possible ways of providing the computer program product. One example is a computer readable medium, such as a DVD or a CD-ROM or the like having the program code stored thereon, and another example is a file or set of files comprising the program code, which file(-s) is/are downloadable over a network, from a provider.

Further objects and advantages of the present invention will be discussed below by means of exemplifying embodiments.

BRIEF DESCRIPTION OF THE DRAWINGS

Preferred embodiments of the invention will now be described in greater detail with reference to the accompanying drawings, in which:

FIG. 1 is a schematic view of a jetting machine system wherein the present invention is applicable;

FIG. 3-7 schematically show further screen images, generated in accordance with an embodiment of the method according to the present invention.

DESCRIPTION OF PREFERRED EMBODIMENTS

The method of the present invention, typically, is integrated into, or cooperates with, a larger frame work in the form of a software for developing and administrating a whole factory or manufacturing line comprising several machines of different types. An example of such a software, that is known, is CircuitCam. The software is also used for developing machine programs, such as jetting programs. In the present case jetting programs for jetting machines are developed by the aid of the method according to the present invention.

In order to provide a practical example in the following description, let us assume that CircuitCam is used. As is understood by the skilled person, there are various software to which the present method is applicable, and in addition the present method can be implemented as a stand alone software as well. All those possibilities are encompassed by the scope of the appended claims.

As illustrated in FIG. 1, let us assume that there is a jetting machine 1 in which substrates 7 will be provided with viscous medium deposits. The CircuitCam is run on a computer 3, which communicates with the machine 1. CircuitCam has a database, which holds principal manufacturing data about substrates, e.g. PCBs, machine data for the machine in which the substrates are to be processed, etc. Substrate data 5 about substrates is imported to the CircuitCam database, preferably in the form of CAD data comprised in a CAD file. In this embodiment of the method for generating a jetting program according to the present invention, the software for performing the generation of a jetting program is integrated in CircuitCam. Here, the generation software, or generation program, is called a machine interface. The machine interface is available off-line, in order for an operator to be able to work with the jetting program generation without interfering with any simultaneous running of the machine the control software of which is to be provided with the jetting program. Within the scope of the invention, there are several alternative possibilities for how the machine interface is provided, as explained above. One possibility thereof is on a computer readable medium, which is illustrated by a CD-ROM 9 in FIG. 1.

Figure 2:
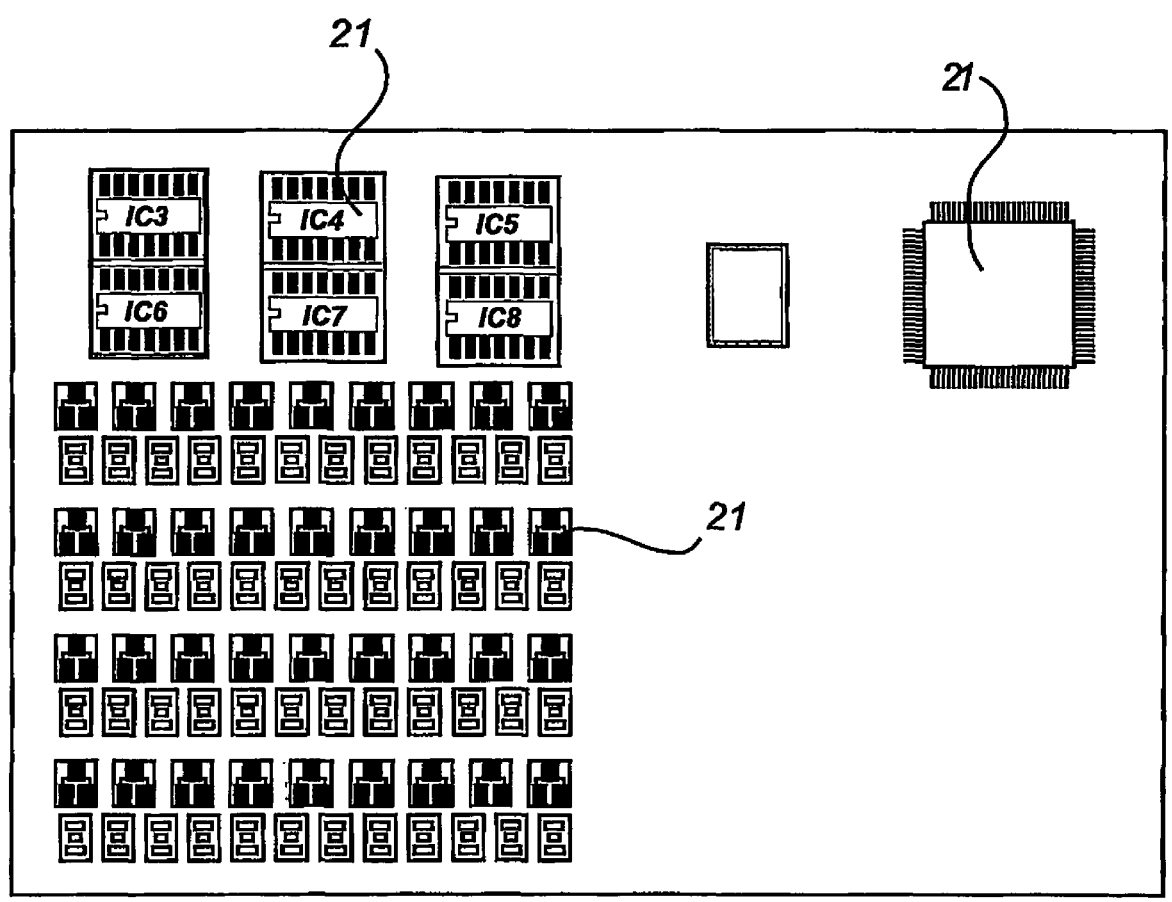
FIG. 2 schematically shows a screen image, generated in accordance with an embodiment of the method according to the present invention, of components to be mounted on a substrate.

The jetting program for a specific machine, or a plurality of machines that will use the same jetting program, is generated as follows. First the operator, working on the computer 3 where CircuitCam has been loaded, on basis of the CAD data for a substrate, assigns the components that are to be placed on the substrate to the machine by means of CircuitCam. Component data about the components, such as their extension, regarding the housing as well as the leads, if any, and their position on the substrate, is comprised in the substrate data. The operator notes existing names of the components, or gives them names. The screen image for the step of assigning components comprises an image of all components 21 which are to be mounted on the substrate, as illustrated in FIG. 2. Here the assignment of components can be copied to other machines as well, if they are to process the same substrate. It is to be noted that generally the representations related to components, reception areas, etc., in the figures, are considerably simplified and enlarged models of the reality.

Figure 3:
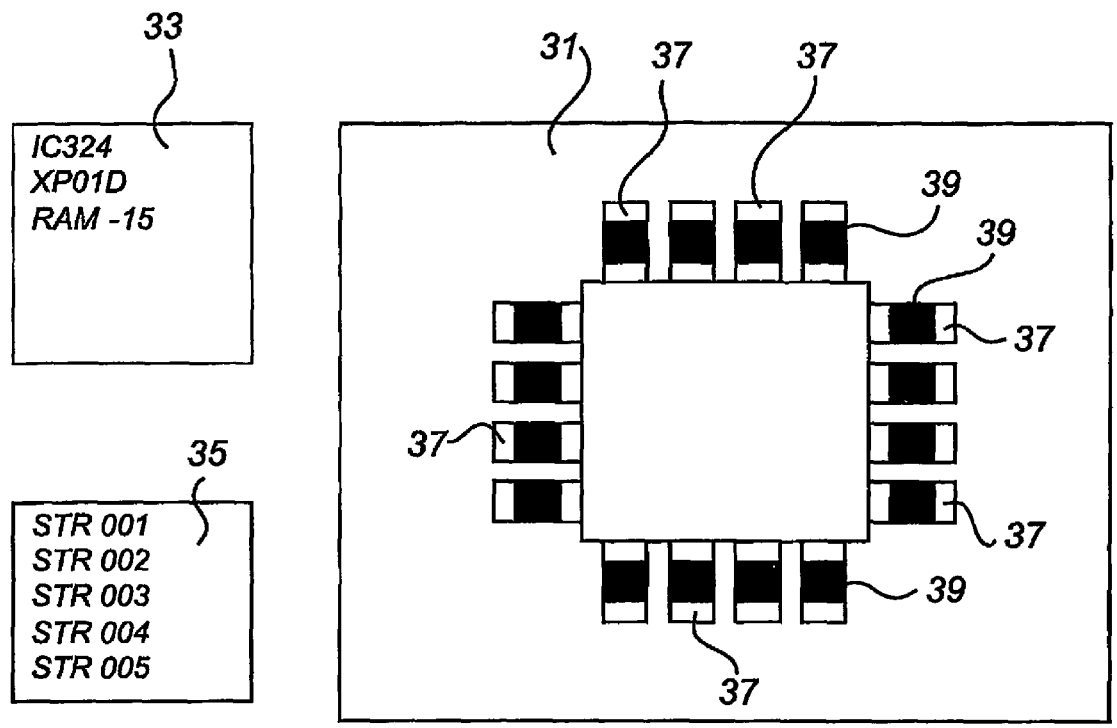
Figure 8:
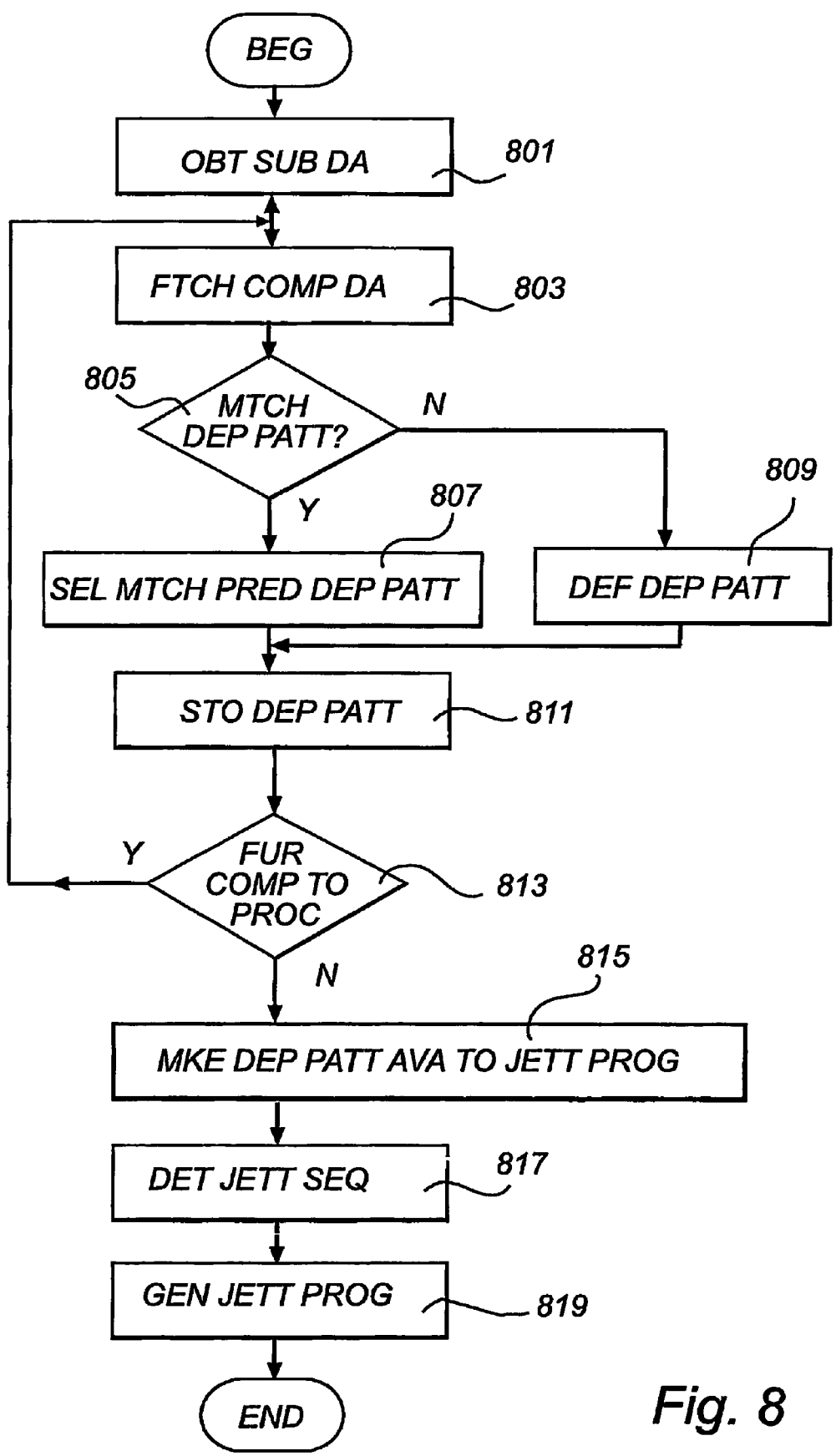
FIG. 8-9 are flow charts illustrating steps which are performed in accordance with embodiments of the method according to the present invention.
Figure 9:
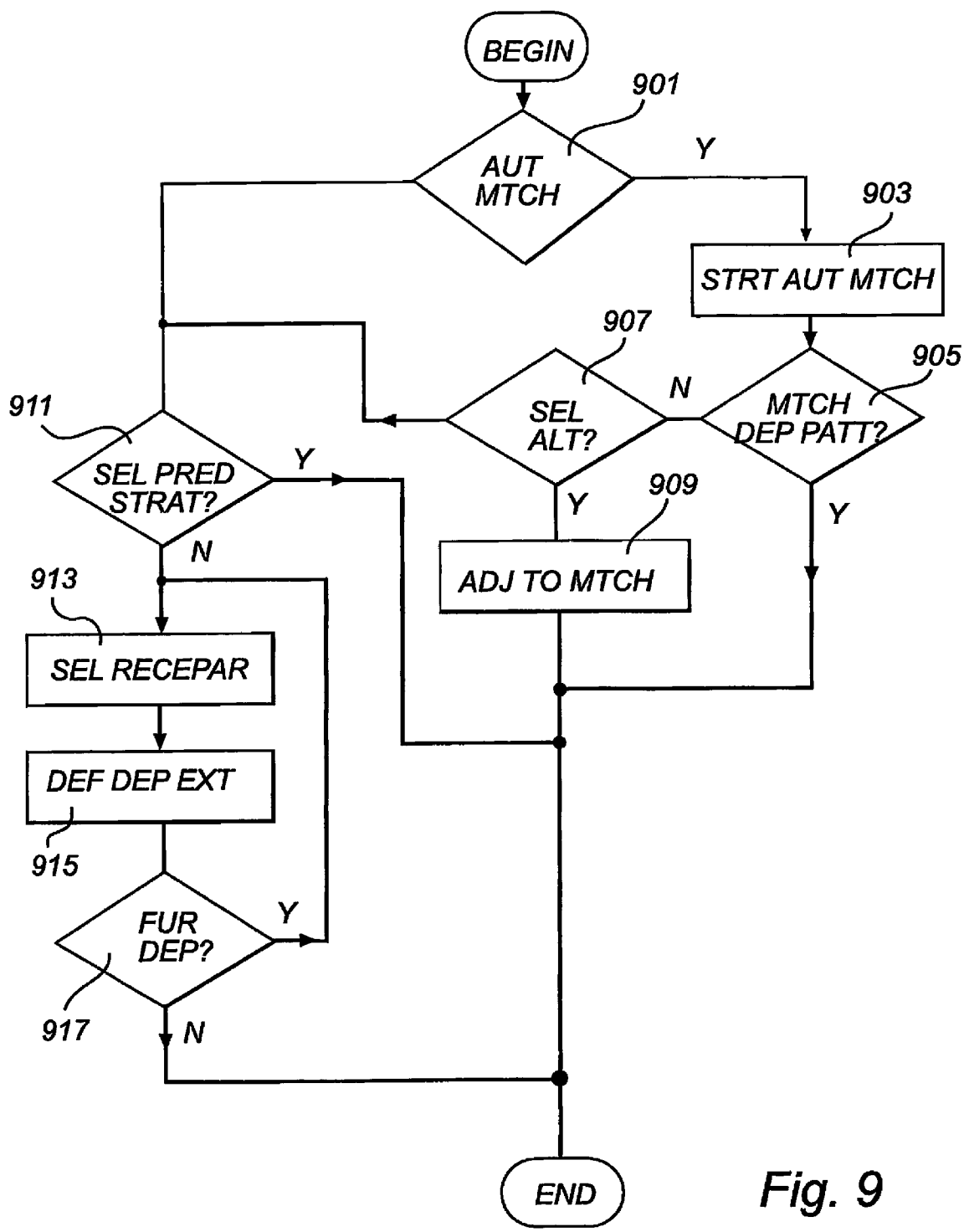

By then opening the machine interface for the present machine on the computer 3, the operator begins the procedure of generating data for the jetting program. This procedure is illustrated in the flow charts of FIGS. 8 and 9. A main task is to define deposit patterns which are related to the components. The first image that appears is similar to the one in FIG. 2, based on substrate data obtained, box 801, as explained above. By choosing a component in the image, box 803, another screen image, as shown in FIG. 3, appears. The component data in box 31 comprises reception areas 37 of the substrate, as discussed above. The interface program has selected any predefined deposit pattern, box 805, if such a pattern exists, which has previously been defined for the present component. An image of the reception areas 37 and the associated deposits 39, are now shown on the screen, as in FIG. 3, where the deposits are represented by black rectangles, together with a list 33 of the other components which belong to the present substrate, and a list 35 of different strategies for generating a deposit pattern. The other components in the list 33 have also been associated with predefined deposit patterns, when the program has found such a deposit pattern. Thus, the list can also be considered to represent, to a greater or smaller extent, different deposit patterns.

In the most simple case, there will be merely one reception area 37. A reception area can be any area that is intended for receiving something on the substrate. Typical examples are a pad, or another conducting structure that is already physically provided on the substrate 7, and which is meant to first receive viscous medium, and then receive a component lead on top of the medium. A further example is an area of the substrate that is intended to receive a component lead, or the whole or a part of a component housing surface. A future possibility is an area that is intended to receive all or a part of an amount of viscous medium that constitutes a component itself.

Figure 4:
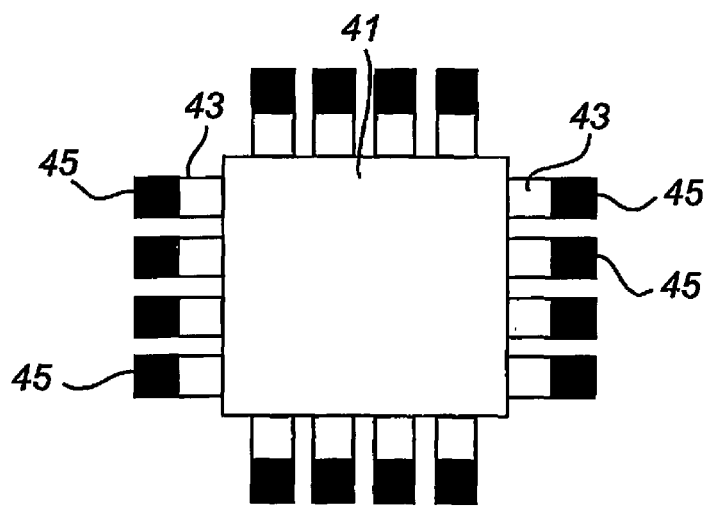

As regards the deposits 37, for example, they are displayed as rectangular areas having a colour that differs from the colour of the reception areas. Thus, the deposit pattern comprises deposit data for each individual reception area. In this embodiment it is assumed that all deposits 37 are rectangular in shape. In practice, of course, a strict rectangular shape is not possible to obtain since the viscous medium is jetted as droplets. Each deposit is defined by its size in the x and y directions and by its volume. The volume is initially set to a default value, determined by the software on basis of the machine data, including for example droplet size. As will be further explained below the volume as well as the x and y sizes may be adjusted by the operator. The stored deposit data for a certain component also contains relative positioning data, i.e. information about how each deposit will be positioned in relation to the associated reception area. Thus, for example, it can be desirable to centre the deposit within the area, but also, to displace it to one or the other end of the reception area, and/or to one or the other side of the reception area, as shown in FIG. 4. The case of displacement is present when the deposit is smaller than the reception area, which is common. In FIG. 4 a component 41 and its associated reception areas 43 are illustrated. The deposits 45 have been displaced towards the outer ends (as seen from the component 41) of the reception areas 43.

If the selected predefined deposit pattern matches a desired one, the operator thus moves on to another component, boxes 807, 811 and 813. If it does not, or if no deposit pattern is predefined, the operator has to define a deposit pattern, box 809, for the present component. There are several different ways to define a deposit pattern. Some of these are illustrated in the flow chart of FIG. 9. In accordance with this embodiment there is provided, in the list of strategies 35, a number of alternative strategies for semi-automatically defining a deposit pattern. The strategies include an auto match algorithm, which will attempt to find the best programming option among all previously stored deposit patterns. Thus, if the operator chooses to use the auto match algorithm, in boxes 901 and 903, auto match will look for a pattern that matches the number of reception areas for the present component, box 905. It will also look at the relative size of the component and the footprint thereof and, if necessary, scale the deposit pattern accordingly. This scaling is illustrated in FIG. 5, were the component has two reception areas 57, 59. In the illustrated example, the predefined deposit pattern 55 is adopted to reception areas 51, 53 having a width that is narrower than the width of the present reception areas 57, 59. Auto match retains the proportional intentions of the predefined deposit pattern, as to relative position and coverage of the deposits by slightly widening the deposits 58 in order to adopt them to the present reception areas 57, 59. This operation is based on the assumption that components which are rather alike have about the same needs as regards the viscous medium deposits. Thus, by selecting the alternative of auto match the operator may generate a proper deposit pattern in a single operation. If no perfect match is obtained, the auto match algorithm will list, sorted by percent match, the most likely alternatives and to what extent they match. Then the operator has the opportunity to choose an alternative, box 907, and adjust it into a full match, box 909, or to reject all alternatives and create a deposit pattern from scratch. In either case the inventive method will provide, by means of the machine interface program, efficient tools for rationalising the programming of deposits.

If the operator starts from one of the deposit patterns on the list generated by auto match the only further action that the operator has to take is to make modifications thereof.

When programming a completely new deposit pattern for the present component, the operator has two options of action. One option is to choose a predefined strategy, box 911, for generating the deposits from the list of strategies 35, where several different strategies are predefined. They are, typically, based on different combinations of reception area coverage and positioning in relation to the reception area.

The other option is to perform a more manual programming. Then a more detailed screen image is displayed, as shown in FIG. 6. This image is also used above when adjusting a selected alternative from the list generated by auto match. In this detailed image the operator selects, box 913, one or more reception areas 62 in a partial image 61 showing all reception areas 62 for the present component. Also in this detailed image the operator then has the option of merely defining, box 915, a reception area coverage in percent of the dimensions of the reception area in the x and y directions 64, 66, in another partial image 63 of FIG. 6. Thus, by choosing one or more of the reception areas 62 or, when adjusting a previous deposit pattern, deposits 64, in the image, and specifying percentage values, the operator defines deposit data for one or more of the deposits 64 of the deposit pattern. By default the deposits are centred within the reception areas. If this basic programming is insufficient because the deposits should preferably be off-centre positioned, then there are alternative distribution models, two of which are shown in another partial image 69. For example, the deposits can alternating be placed close to one and the other end of the reception areas respectively, as shown in the partial image 69, as well as in the partial image 61 of the reception areas. In an alternative embodiment of the method, there is no default distribution, but it has to be chosen as well as the reception area coverage.

A further option in this detailed image is to define an offset for the deposit(-s) in a box named "OFFS" in FIG. 6. The offset is a value of a displacement of the deposit(-s) in relation to the pad(-s). For example, in one embodiment, a positive offset value means that the deposit(-s) is/are moved further away from the centre of the component. Thus, for example, starting with the deposit positions of FIG. 3, the deposit positions of FIG. 4 are easily obtainable by choosing an appropriate value of the offset. A further option is to define the volume of the deposit in a volume box 70 of another partial image 65 of the detailed screen image. The volume is related to the thickness of the deposit. A volume value of 100% represents a default volume for a given deposit area, which corresponds to a default thickness. To give an example, an appropriate default thickness for some types of substrates and components is in the order of $10^{-4}$ m. The volume is adjustable to more or less than 100%, which will render a deposit that is thicker or thinner than the default thickness. A range of tolerance is also definable, by means of minimum, and maximum values, which are entered in corresponding boxes 72, 74 on the screen. A zero tolerance, i.e. the same percentage values in the min, max and volume boxes, will force the program to try to achieve a deposit as close to the input value as possible. This accuracy is however naturally limited, for example by the size of a droplet of viscous medium. The smaller the tolerance is the longer the times of calculation and processing will become.

There are several other options of programming the deposits. These options represent different advantages such as being more detailed, more individualised, etc. For example, as is evident from FIG. 6 at 67, a further option is to define the very xy coordinates of the deposit, in terms of centre coordinates for the deposit. In conjunction with the centre coordinates the deposit x and y extensions are displayed and they are adjustable as well.

Hitherto it has been assumed that the shape of a deposit is a square. However, within the scope of this invention any shape is allowed. In the illustrated embodiment there is an option of choosing the shape, as illustrated in FIG. 6 by a shape box 71. If, for example it is decided that a deposit should be circular, the specification of size will be amended into a more suitable form, such as a centre coordinate plus a radius, and the coverage, for example, will be defined as a single percentage of the area of the deposit, or as a percentage of the radius or diameter, or as a radial distance from the circumference of the deposit.

In accordance with an alternative embodiment, where the component data does not contain any reception area data, the data for the jetting program is generated as follows. Substrate data is obtained as explained above, and component data for a chosen component is fetched. The component data in this case comprises a definition of the component extension, or the lead extensions, or a combination thereof, and a position that does not enable a representation in the form of reception areas in accordance with the definition made above. If a matching predetermined deposit pattern exists, i.e., in this case, a deposit pattern matching the leads of the component or the very component, it is selected as explained above. However, if no matching deposit pattern exists, a suitable deposit extension and a suitable deposit position on the substrate are determined.

An alternative situation where a reception area may be non-defined is where, for some reason, there is no extension data on the component, but merely the position and extension of the pads are known, and it is also known that a component is to be placed such that it uses the pads. This situation could for example exist if an amount of an adhesive is to be deposited below the component housing in order to fix the component on the substrate. Then, the deposit pattern will be determined such that the deposits do not touch the pads.

Figure 7:
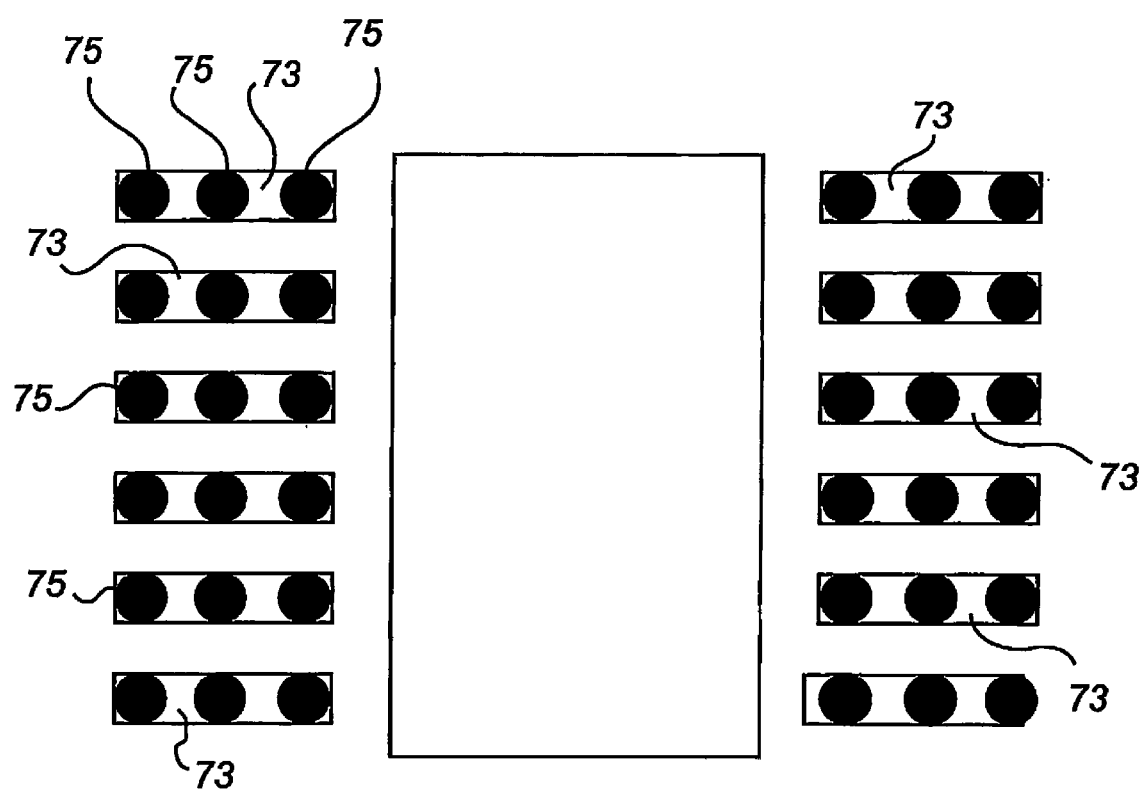

Now, when the deposit patterns for all components which are to be mounted on the substrate have been completed, box 815, the next step is to determine a jetting sequence, box 817. This step includes a step of converting the deposits into droplets. This conversion is done by the machine interface, where it uses the machine data about what type(s) of nozzle(s) that is present in the jetting machine 1. The nozzle information provides knowledge about droplet size, and, thus, the program is able to determine how many droplets that will be needed to build up a specific deposit, and also where within the xy extension of the specific deposit the droplets should be jetted. The resulting droplet configuration is exemplified in FIG. 7, where the outer rectangle 73 represents the limits of the deposit, and the circles 75 represent the droplets. It is possible to display such images on the screen for all deposits of all deposit patterns. When the droplet configurations are being determined the machine interface considers the data about deposit volume and any tolerances thereof defined by the operator. Since the deposits are represented as rectangles and the droplets indeed are circular, a perfect match will never be obtained, but good enough approximations will certainly be obtained in general. However, it may happen that the present droplet size makes it impossible to obtain an acceptable accuracy, and then an error note thereof will be generated. For example, if the defined deposit is smaller than the smallest droplet available, or if the volume max. and min. limits are too narrow, etc., it will/may not be possible to obtain the defined deposit. As an alternative to generating an error message in conjunction with the conversion into droplet configurations, the machine interface at start up determines limits for the deposit properties and then alerts the operator if he/she tries to define a deposit that can not be approximated at a satisfactory level of accuracy.

When the droplet configurations have been determined, the next step is to determine an optimised path that the jetting nozzle will be moved along during the jetting operation. There are several known algorithms for performing such a path optimisation, one of which, for example, is used in the known CADImport program referred to above.

Finally, the very jetting program is generated, box 819, on basis of the jetting sequence, i.e. on basis of the droplet configurations and nozzle movement path. Also this compilation requires no more than an initiating keystroke of the operator and the software will take care of the rest. This compilation as such is also known to a person skilled in the art, and will not be further described.

In the above no distinction between component type and component individual has been made. In a preferred embodiment of the invention all components of the same type are treated in the same way and deposits are assigned only once for each component type. However, the operator may treat one or more individual components different than the rest of the components of that type. This is useful when problems related to substrate layout occur.

In an alternative embodiment of the method according to the invention further steps are added to generate an inspection program to be executed after completing execution of at least parts of the jetting program. The operator makes a choice on substrate level (FIG. 2) regarding whether inspection is desired for the entire substrate. If this is not desired the operator makes a choice on component type level (FIG. 3), i.e. regarding whether all components of a specific type on the substrate will be inspected or not. As a further option only some of the reception areas are chosen for inspection. The last-mentioned approach can be used to decrease the time needed for inspection of the substrate. The operator can also specify inspection of a particular component, or some of its reception areas, on the substrate.

When generating the inspection program the software uses the deposit extension, possibly with some added tolerance, to define allowed viscous medium positioning. This means that if, during execution of the inspection program, viscous medium is detected outside the areas defined in this way an error is reported. In addition, or as an alternative, the volume limits entered in boxes 72 and 74, possibly with some added tolerance, are used as error indicating limits for the measured volumes. The tolerances referred to above are defined as default values in the system and are meant to reflect the quality demand on the final product. The values need not be defined for each substrate that is to be programmed.

The invention claimed is:

1. A computerized method for generating data for a droplet jetting program with respect to a computer controlled droplet jetting machine, and for jetting droplets, where droplet jetting is a non-contact dispensing process using a fluid jet to form and shoot droplets of a viscous medium onto a substrate, comprising the steps of:

a) obtaining substrate data for a substrate, which is to be provided with deposits and components, wherein each of the deposits is a connected amount of viscous medium applied at a position on a substrate as a result of one or more jetted droplets and each of the deposits is defined by its size in the x and y directions and by its volume; and b) for each component which is to be placed on the substrate:

fetching component data for the component from said substrate data; and using a computer to select a matching predefined deposit pattern, by means of the component data, among stored deposit patterns which have been previously defined for different components, the predefined deposit pattern comprising at least one deposit, which matches the number of reception areas of a desired deposit pattern for said component data, wherein the deposit pattern comprises, for the/each deposit, deposit data comprising deposit extension and deposit position; and if no matching predefined deposit pattern exists, defining a deposit pattern, comprising at least one deposit, for the component data, comprising:

defining, for the/each deposit, deposit data, which comprises determining deposit extension and deposit position;

c) utilizing the deposit data in operation of the droplet jetting machine comprising automatically determining, without user input other than initiation of the automatic determining operation, how many droplets will be needed to build up a deposit and where the droplets are jetted; and jetting droplets onto the substrate according to the determination of how many droplets will be needed to build up a deposit and where the droplets are jetted.

2. A method according to claim 1, wherein said component data comprises at least one predefined reception area of the substrate, wherein at least a part of the/each reception area is to be covered with a deposit, wherein said step of defining deposit data comprises determining a reception area coverage for the associated reception area.

3. A method according to claim 2, wherein said step of defining deposit data comprises the step of defining a deposit position relative to the associated reception area.

4. A method according to claim 3, wherein said step of defining a deposit position relative to the associated reception area is performed for all deposits of said at least one deposit in one operation.

5. A method according to claim 1, wherein said step of defining deposit data comprises the step of defining a deposit volume.

6. A method according to claim 5, wherein the deposit volume is defined by adjusting a predefined default volume.

7. A method according to claim 1, wherein said step of adjusting the deposit data of the non-matching deposit pattern comprises scaling of the deposits.

8. A method according to claim 7, wherein said scaling is performed on all deposits of the deposit pattern in one operation.

9. A method according to claim 1, wherein said step of defining deposit data comprises defining deposit extension for all deposits of said at least one deposit in one operation.

10. A method according to claim 1, wherein said step of defining deposit data comprises applying said deposit pattern to all components of the same type in said substrate data.

11. A computer program product comprising a computer-readable storage medium having stored therein computer readable program code for performing the method according to claim 1.

12. The method of claim 1, further comprising selecting a list of strategies for generating a deposit pattern..

13. The method of claim 12, further comprising providing in the list of strategies a number of alternative strategies for semi-automatically defining a deposit pattern.

14. The method of claim 13, wherein the list of alternative strategies includes an auto match algorithm.

15. A computerized method for generating a jetting program for a computer controlled viscous medium jetting machine, and for jetting droplets, where droplet jetting is a non-contact dispensing process using a fluid jet to form and shoot droplets of a viscous medium onto a substrate, comprising the steps of:

a) obtaining substrate data for a substrate, which is to be provided with deposits and components, wherein each of the deposits is a connected amount of viscous medium applied at a position on a substrate as a result of one or more jetted droplets and each of the deposits is defined by its size in the x and y directions and by its volume;

b) for each component which is to be placed on the substrate:

fetching component data for the component from said substrate data; and selecting a matching predefined deposit pattern, comprising at least one deposit, which matches the number of reception areas of a desired deposit pattern for said component data, wherein the deposit pattern comprises, for the/each deposit, deposit data comprising deposit extension and deposit position; and if no matching predefined deposit pattern exists, defining a deposit pattern, comprising at least one deposit, for the component data, comprising the step of defining, for the/each deposit, deposit data, which step comprises determining deposit extension and deposit position;

c) determining a jetting sequence on basis of the deposit patterns; comprising the step of converting the deposit patterns to droplet configurations, on basis of the deposit patterns, wherein the step of converting the deposit patterns to droplet configurations comprises automatically determining, without user input other than initiation of the automatic determining operation, how many droplets will be needed to build up a specific deposit, and where within the extension of the specific deposit the droplets should be deposited, and d) generating a jetting program on basis of the jetting sequence.

16. A method according to claim 15, wherein said step of determining a jetting sequence comprises the step of converting the deposit patterns to droplet configurations.

17. A method according to claim 16, wherein said conversion is done by means of an algorithm using predefined machine data and said deposit data.

18. A method according to claim 16, wherein said step of determining a jetting sequence further comprises the step of optimising a path of movement for a jetting nozzle, which path covers the droplet configurations.

19. A computerized method for generating data for a droplet deposit jetting program with respect to a computer controlled droplet jetting machine, and for jetting droplets, where droplet jetting is a non-contact dispensing process using a fluid jet to form and shoot droplets of a viscous medium onto a substrate, comprising the steps of:

a) obtaining substrate data for a substrate, which is to be provided with deposits, each being a connected amount of viscous medium applied at a position on a substrate as a result of one or more jetted droplets and each of the deposits is defined by its size in the x and y directions and by its volume, and components; and b) for each component which is to be placed on the substrate:

fetching component data for the component from said substrate data; and using a computer to select a matching predefined deposit pattern by means of the component data among stored deposit patterns which have previously been defined for different components, the predefined deposit pattern comprising at least one jetted droplet deposit, which matches the number of reception areas of a desired deposit pattern for said component data, wherein the deposit pattern comprises, for the/each deposit, deposit data comprising deposit extension and deposit position; and if no matching predefined deposit pattern exists, defining a deposit pattern, comprising at least one deposit, for the component data, wherein said defining a deposit pattern comprises at least one of:

selecting a predefined deposit pattern which is computer adjustable into match, and adjusting the selected deposit pattern into match;

presenting predefined deposit patterns with an indication of the extent to which they match with said component data; and receiving input defining a new deposit pattern, comprising, for the/each deposit, deposit data comprising deposit extension and deposit position; and c) utilizing the deposit data in operation of the droplet jetting machine comprising automatically determining, without user input other than initiation of the automatic determining operation, how many droplets will be needed to build up a deposit and where the droplets are jetted; and jetting droplets onto the substrate according to the determination of how many droplets will be needed to build up a deposit and where the droplets are jetted.

20. The method of claim 19, further comprising specifying inspection of fewer than all substrate components after jetting of deposits on the substrate.

\* \* \* \* \*